US012700441B2

(12) United States Patent (10) Patent No.: US 12,700,441 B2
Anderson (45) Date of Patent: Aug. 4, 2026

(54) MEMORY SUBARRAY AND INTERCONNECTION CIRCUIT ARRANGEMENT

(71) Applicant: Micron Technology, Inc., Boise, ID (US)

(72) Inventor: Jacob Robert Anderson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 18/391,380

(22) Filed: Dec. 20, 2023

(65) Prior Publication Data

US 2024/0212731 A1 Jun. 27, 2024

Related U.S. Application Data

(60) Provisional application No. 63/476,792, filed on Dec. 22, 2022.

(51) Int. Cl.
*G11C 8/08* (2006.01)
*G11C 5/06* (2006.01)
*G11C 7/08* (2006.01)
(52) U.S. Cl.
CPC ................ *G11C 8/08* (2013.01); *G11C 5/063* (2013.01); *G11C 7/08* (2013.01)
(58) Field of Classification Search
CPC .............. G11C 8/08; G11C 5/063; G11C 7/08

USPC ....................................................... 365/185.23
See application file for complete search history.

(56) References Cited

U.S. PATENT DOCUMENTS

| | | | | |
|---|---|---|---|---|
| 10,937,806 | B2* | 3/2021 | Tao | H10B 43/10 |
| 2018/0239531 | A1* | 8/2018 | Lea | G11C 11/4091 |
| 2021/0012817 | A1* | 1/2021 | Laurent | G11C 7/12 |
| 2022/0084560 | A1* | 3/2022 | Castro | H10N 70/8833 |
| 2023/0236752 | A1* | 7/2023 | Lea | G06F 3/0647 |
| | | | | 711/105 |

* cited by examiner

*Primary Examiner* — Connie C Yoha
(74) *Attorney, Agent, or Firm* — Holland & Hart LLP

(57) ABSTRACT

Methods, systems, and devices for memory array circuit arrangement are described. A memory device may include a memory subarray, which may include a complementary metal oxide semiconductor (CMOS) circuitry under array (CuA) circuitry area and a word line driver region (e.g., word line driver circuitry) or a digit line driver region (e.g., digit line driver circuitry, sense amplifier circuitry multiplexed with the digit line driver circuitry). The memory subarray may include a first interconnect extending in a first and traversing at least a first portion of the CuA circuitry area of the memory subarray. The first interconnect may be coupled with the first portion of the CuA circuitry area and a first interconnection layer. Additionally, each memory subarray may include a second interconnect extending in a second direction and traversing at least a second portion of the CuA circuitry area of the memory subarray.

11 Claims, 8 Drawing Sheets

405-a 405-b 410-a 425    415-a

430

CuA
Circuitry
420

430

425

410-b 415-b 405-c 405-d

400

Legend

| | | | |
|---|---|---|---|
| Memory Subarray 405 | Word Line Driver Region 410 | Digit Line Driver and Sense Region 415 | |

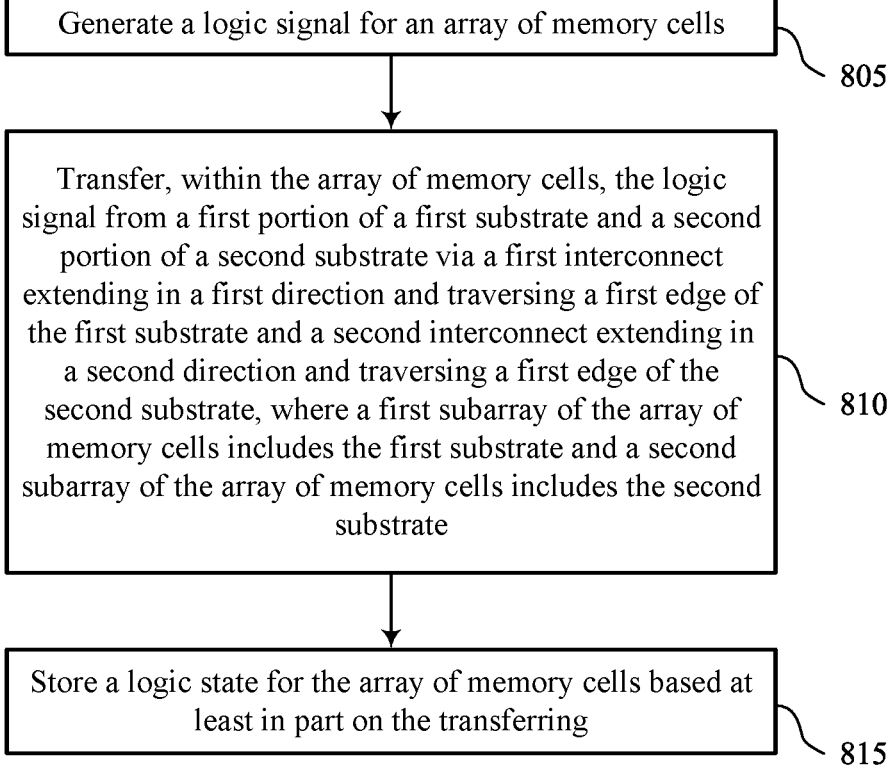

Generate a logic signal for an array of memory cells

805

Transfer, within the array of memory cells, the logic signal from a first portion of a first substrate and a second portion of a second substrate via a first interconnect extending in a first direction and traversing a first edge of the first substrate and a second interconnect extending in a second direction and traversing a first edge of the second substrate, where a first subarray of the array of memory cells includes the first substrate and a second subarray of the array of memory cells includes the second substrate

810

Store a logic state for the array of memory cells based at least in part on the transferring

MEMORY SUBARRAY AND INTERCONNECTION CIRCUIT ARRANGEMENT

CROSS REFERENCE

The present application for patent claims priority to and the benefit of U.S. Provisional Application No. 63/476,792 by Anderson, entitled "MEMORY ARRAY CIRCUIT ARRANGEMENT," filed Dec. 22, 2022, assigned to the assignee hereof, and is expressly incorporated by reference in its entirety herein.

TECHNICAL FIELD

The following relates to one or more systems for memory, including memory array circuit arrangement.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

BRIEF DESCRIPTION OF THE DRAWINGS

FIG. 8 illustrates a flowchart showing a method or methods that support memory array circuit arrangement in accordance with examples as disclosed herein.

DETAILED DESCRIPTION

Figure 1:
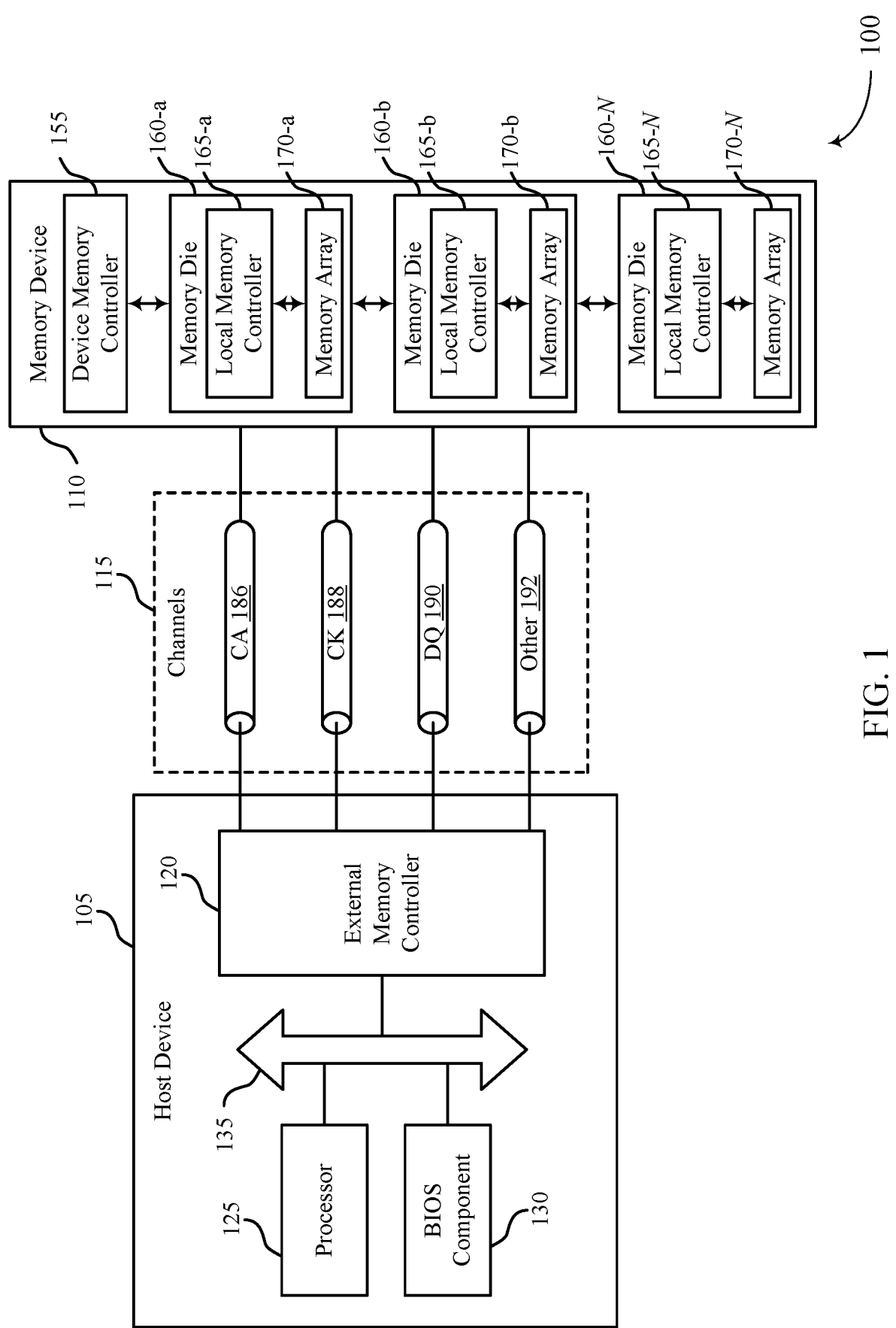
FIG. 1 illustrates an example of a system that supports memory array circuit arrangement in accordance with examples as disclosed herein.

A memory device may include various arrangements of memory arrays and supporting control circuitry formed over (e.g., directly over, over one material or layer and one or more other materials or layers, in contact with) a substrate. For example, a memory device may include substrate-based control circuitry, complementary metal oxide semiconductor (CMOS) circuitry under array (CuA) circuitry, or the like. Additionally, or alternatively, the memory device may include driver circuitry to control the operation of memory cells associated with the memory device. For example, the memory device may include word line drivers, each configured to selectively activate or deactivate a word line associated with a memory cell of the memory device. The memory device may additionally include digit line drivers, each configured to selectively activate or deactivate a digit line associated with a memory cell of the memory device. The memory device may additionally or alternatively, include sense amplifier circuitry to amplify an output of a memory cell associated with the memory device.

The memory device may include a memory array, which may be partitioned into multiple subarrays. Each subarray may be configured with one or multiple driver regions, which may include one or more driver circuitry (e.g., word line drivers, digit line sense and drivers). In some cases, a word line driver region (e.g., including word line driver circuitry) may be located substantially within a footprint of a subarray and near a peripheral (e.g., an edge) of the subarray. Similarly, a digit line driver region (e.g., including digit line sense and driver circuitry) may also be located substantially within the footprint of the subarray and near the periphery (e.g., edge) of the subarray. Each subarray may be connected, directly or indirectly, with one another through interconnection regions. Additionally, each subarray may include CuA circuitry to support various operations (e.g., logic). In some cases, the CuA circuitry might be split over the various subarrays of the memory array due to the arrangement of the driver regions (e.g., word line driver circuitry, digit line sense and driver circuitry) within each subarray. The splitting of the CuA circuitry over the various subarrays of the memory array may demand higher power delivery and longer signal propagation.

Various aspects of the present disclosure relate to a memory architecture that support a greater area for CuA circuitry that may result in lower power delivery and shorter signal propagation. As described herein, a memory device may include a memory array including one or more memory subarrays. A memory subarray may be associated with one fourth of a CuA area (e.g., including peripheral logic) and one or both of a word line driver region (e.g., word line driver circuitry) or a digit line driver region (e.g., digit line driver circuitry and sense amplifier circuitry multiplexed to the digit line). Each memory subarray may include a first interconnect (e.g., an interconnection region also referred to as a socket feed through area) extending in a first direction (e.g., extending along the x-direction, along the y-direction) and traversing at least a first portion of a first substrate of the memory subarray. The first interconnect may be coupled with the first portion of the first substrate and a first interconnection layer. Additionally, each memory subarray may include a second interconnect (e.g., an interconnection region also referred to as a socket feed through area)

extending in a second direction (e.g., extending along the x-direction, along the y-direction) and traversing at least a second portion of the first substrate of the memory subarray. The second interconnect may be coupled with the second portion of the first substrate and the first interconnection layer.

Figure 2:
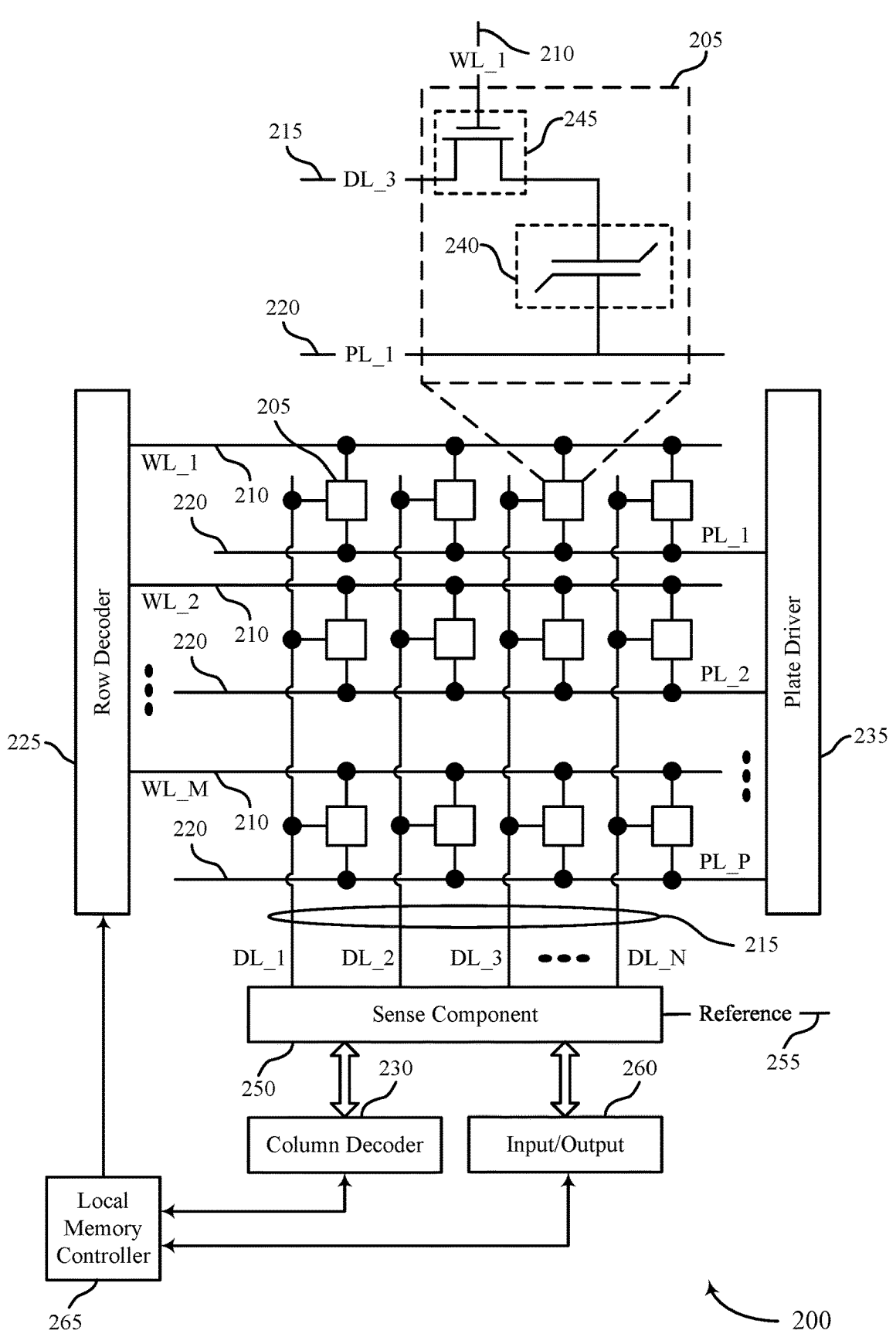
FIG. 2 illustrates an example of a memory die that supports memory array circuit arrangement in accordance with examples as disclosed herein.

Features of the disclosure are initially described in the context of systems and dies with reference to FIGS. 1 and 2. Features of the disclosure are described in the context memory architecture with reference to FIGS. 3 through 6. These and other features of the disclosure are further illustrated by and described with reference to an apparatus diagram and flowchart that relate to memory array circuit arrangement as described with reference to FIGS. 7 and 8.

FIG. 1 illustrates an example of a system 100 that supports memory array circuit arrangement in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device 110 may include a memory array including one or more memory cells (e.g., one or more memory dies 160). The memory array may be configured to include one or more memory subarrays. A memory subarray may include a fraction of a CuA area (e.g., including peripheral logic) and one or both of a word line driver region (e.g., word line driver circuitry) or a digit line driver region (e.g., digit line driver circuitry and sense amplifier circuitry multiplexed to digit lines). Each memory subarray may include a first interconnect (e.g., a vertical interconnection region also referred to as a socket feed through area) extending in a first direction (e.g., extending along the x-direction, along the y-direction) and traversing at least a first portion of a first substrate of the memory subarray. The first interconnect may be coupled with the first portion of the first substrate and a first interconnection layer. Additionally, each memory subarray may include a second interconnect (e.g., an interconnection region also referred to as a socket feed through area) extending in a second direction (e.g., extending along the x-direction, along the y-direction) and traversing at least a second portion of the first substrate of the memory subarray. The second interconnect may be coupled with the second portion of the first substrate and the first interconnection layer.

Accordingly, the memory architecture supports a greater area for CuA circuitry that may result in lower impedance power delivery and shorter signal propagation. The arrangement (e.g., the placement, the position, the location of) the word line driver regions (e.g., word line driver circuitry), the digit line driver regions (e.g., digit line driver circuitry, sense amplifier circuitry multiplexed to digit lines), and the interconnect regions, result in an increase in a contiguous area used for CuA circuitry that may result in lower impedance power delivery and shorter signal propagation.

FIG. 2 illustrates an example of a memory die 200 that supports memory array circuit arrangement in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 265 may identify a target memory cell 205 on which to perform the write operation. The local memory controller 265 may identify a target word line 210 and a target digit line 215 coupled with the target memory cell 205 (e.g., an address of the target memory cell 205). The local memory controller 265 may activate the target word line 210 and the target digit line 215 (e.g., applying a voltage to the word line 210 or digit line 215) to access the target memory cell 205. The local memory controller 265 may apply a signal (e.g., a write pulse, a write voltage) to the digit line 215 during the write operation to store a specific state (e.g., polarization, such as for FeRAM) in the capacitor 240 of the memory cell 205. The signal used as part of the write operation may include one or more voltage levels over a duration in conjunction with one or more voltage levels on the plate line 220, for example, for FeRAM.

The local memory controller 265 may be operable to perform a read operation (e.g., a sense operation) on one or more memory cells 205 of the memory die 200. During a read operation, the state (e.g., logic state, charge state, polarization state) stored in a memory cell 205 of the memory die 200 may be evaluated (e.g., read, determined, identified). The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal (e.g., charge, voltage) to the sense component 250 in response to biasing the access lines. The sense component 250 may amplify the signal. The local memory controller 265 may activate the sense component 250) (e.g., latch the sense component) and compare the signal received from the memory cell 205 to a reference (e.g., the reference 255). Based on that comparison, the sense component 250 may determine a logic state that is stored on the memory cell 205.

Figure 3:
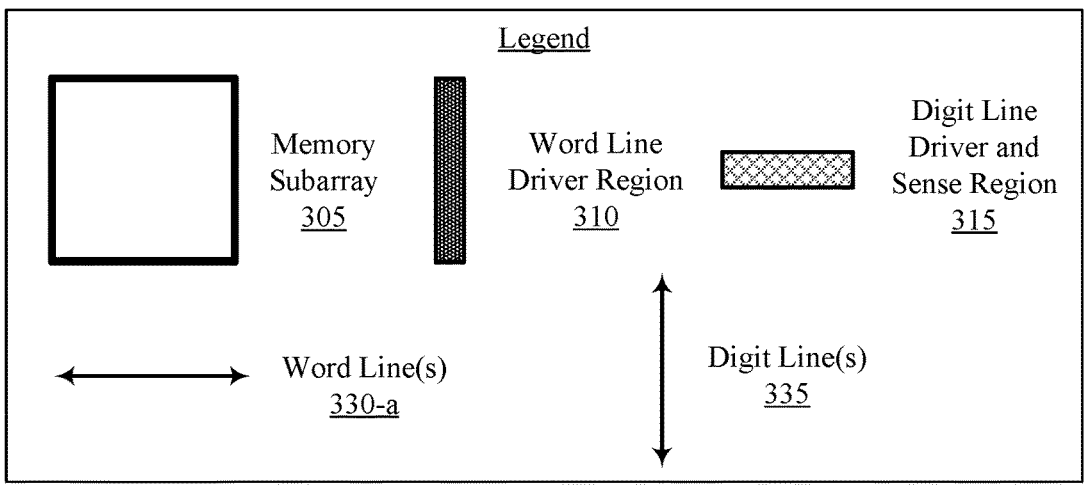
FIGS. 3 through 6 illustrate examples of memory architectures that support memory array circuit arrangement in accordance with examples as disclosed herein.

FIG. 3 illustrates an example of a memory architecture 300 that supports memory array circuit arrangement in accordance with examples as disclosed herein. The memory architecture 300 may be an example of aspects of a memory device as described with reference to FIGS. 1 and 2. The memory architecture 300, or various components thereof, may be an example of means for reducing power delivery impedance for CuA circuitry in a memory device. Additionally, or alternatively, the memory architecture 300, or various components thereof, may be an example of means for reducing signal propagation in a memory device. In the following description of the memory architecture 300, some component (e.g., digit line driver circuitry, word line driver circuitry, sense amplifier circuitry, interconnect circuitry, CuA circuitry, etc.) may also be omitted from the memory architecture 300, and other components (e.g., digit line driver circuitry, word line driver circuitry, sense amplifier circuitry, interconnect circuitry, CuA circuitry, etc.) may be added to the memory architecture 300.

In the example of FIG. 3, the memory architecture 300 may include a memory array, which may include one or more memory subarray's 305, including a memory subarray 305-a, a memory subarray 305-b, a memory subarray 305-c, and a memory subarray 305-d. The memory subarray 305-a may be adjacent to the memory subarray 305-b. The memory subarray 305-c may be adjacent to the memory subarray 305-d. Each of the one or more memory subarrays 305, including the memory subarray 305-a, the memory subarray 305-b, the memory subarray 305-c, and the memory subarray 305-d may include control circuitry formed over (e.g., directly over, over one material or layer and one or more other materials or layers, in contact with) a substrate. For example, each of the one or more memory subarrays 305, including the memory subarray 305-a, the memory subarray 305-b, the memory subarray 305-c, and the memory subarray 305-d may include CuA circuitry, or the like.

The memory subarray 305-a may be configured with a word line driver region 310-a, which may include one or more driver circuitry to control operation for one or more (e.g., a subset or a set of) memory cells associated with the memory subarray 305-a and 305-b. For example, the word line driver region 310-a may include one or more word line driver circuitry configured to selectively activate or deactivate a word line for one or more (e.g., a subset or a set of) memory cells associated with the memory subarray 305-a and 305-b. The word line driver region 310-a may extend in a first direction (e.g., ay-direction). The memory subarray 305-a may also be configured with CuA circuitry 320-a. Similarly, the memory subarray 305-d may be configured with a word line driver region 310-b, which may include one or more driver circuitry to control operation for one or more (e.g., a subset or a set of) memory cells associated with the memory subarray 305-d and 305-c. For example, the word line driver region 310-b may include one or more word line driver circuitry configured to selectively activate or deactivate a word line for one or more memory cells associated with the memory subarray 305-d and 305-c. The word line driver region 310-b may extend in the first direction (e.g., the y-direction). The memory subarray 305-b may also be configured with CuA circuitry 320-b. The word line driver region 310-a may extend generally along the y-direction to connect with word line(s) 330-a that extend in the x-direction. Similarly, the word line driver region 310-b may extend generally along the y-direction to connect with word line(s) 330-*a* that extend in the x-direction.

The memory subarray 305-*b* may be configured with a digit line driver and sense region 315-*a*, which may include one or more driver and sense circuitry to control operation for one or more (e.g., a subset or a set of) memory cells associated with the memory subarray 305-*b* or 305-*d*. For example, the digit line driver and sense region 315-*a* may include one or more digit line driver and sense circuitry configured to selectively activate or deactivate a digit line for one or more memory cells associated with the memory subarray 305-*b* or 305-*d*. The digit line driver and sense region 315-*a* may extend in a second direction (e.g., an x-direction). The memory subarray 305-*c* may also be configured with CuA circuitry 320-*c*.

Similarly, the memory subarray 305-*c* may be configured with a digit line driver and sense region 315-*b*, which may include one or more driver circuitry to control operation for one or more (e.g., a subset or a set of) memory cells associated with the memory subarray 305-*c* or 305-*d*. The digit line driver and sense region 315-*b* may extend in the second direction (e.g., the x-direction). The memory subarray 305-*d* may also be configured with CuA circuitry 320-*d*.

The digit line driver and sense region 315-*a* may extend generally along the x-direction to connect with digit line(s) 335 that extend in the y-direction. Similarly, the digit line driver and sense region 315-*b* may extend generally along the x-direction to connect with digit line(s) 335 that extend in the y-direction.

The memory subarray 305-*b* and the memory subarray 305-*c* may additionally or alternatively, include sense amplifier circuitry, which may be multiplexed with the digit line driver circuitry, to amplify an output for one or more memory cells associated with the memory subarray 305-*b* or 305-*d* and the memory subarray 305-*c* or 305-*d*.

In the memory architecture 300, each of the one or more memory subarrays 305, including the memory subarray 305-*a*, the memory subarray 305-*b*, the memory subarray 305-*c*, and the memory subarray 305-*d* may include one or more interconnect regions (e.g., a socket feed through area with no connections to word lines or digit lines). For example, each of the one or more memory subarrays 305, including the memory subarray 305-*a*, the memory subarray 305-*b*, the memory subarray 305-*c*, and the memory subarray 305-*d* may include a first interconnect region 325 extending in a first direction (e.g., y-direction) and a second interconnect region 330 extending in a second direction (e.g., x-direction). Each of the one or more memory subarray's 305, including the memory subarray 305-*a*, the memory subarray 305-*b*, the memory subarray 305-*c*, and the memory subarray 305-*d* may be associated with one or more interconnection layers (not shown) between a substrate and the first interconnect region 325 and the second interconnect region 330. The one or more interconnection layers may include a metal layer with the same or different resistivity.

Accordingly, the memory architecture 300 supports a greater area for CuA circuitry 320 that may result in lower power delivery impedance and shorter signal propagation without splitting CuA circuitry area. Put another way, the arrangement in the memory architecture 300 (e.g., the placement, the position, the location of) the word line driver regions 310 (e.g., word line driver circuitry), the digit line driver and sense regions 315 (e.g., digit line driver circuitry and sense amplifier circuitry multiplexed with one or more digit lines), and the interconnect regions 325 and 330, result in an increase in an area for CuA circuitry 320 that may result in lower power delivery impedance and shorter signal propagation. For example, the arrangement in the memory architecture 300 (e.g., the placement, the position, the location of) the word line driver regions 310 (e.g., word line driver circuitry), the digit line driver and sense regions 315 (e.g., digit line driver and sense circuitry multiplexed with one or more digit lines), and the interconnect regions 325 and 330, provides the logic associated with the CuA circuitry 320 to be nearer to local interconnect to metal connection areas for easier placement, routing, and reduced signal resistance.

Figure 4:
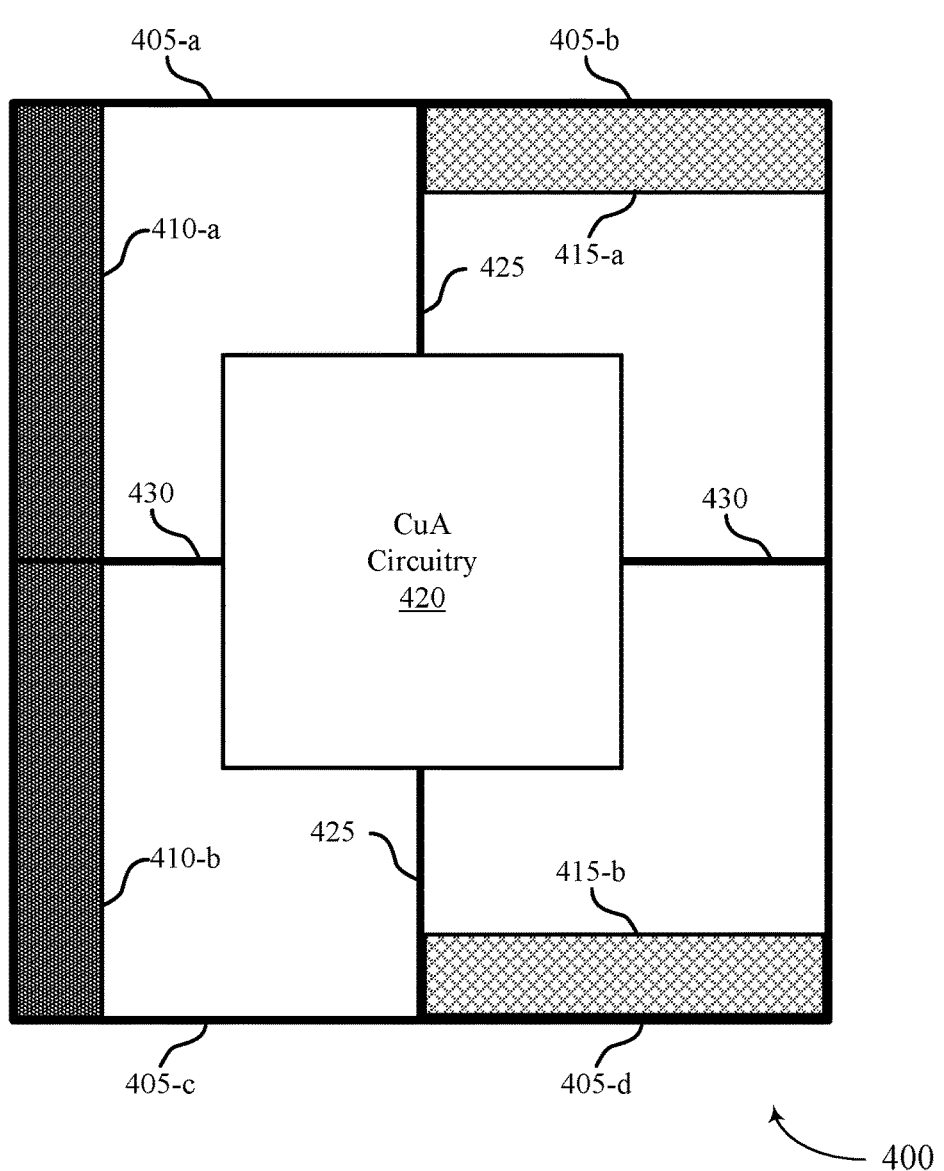
Figure 4:
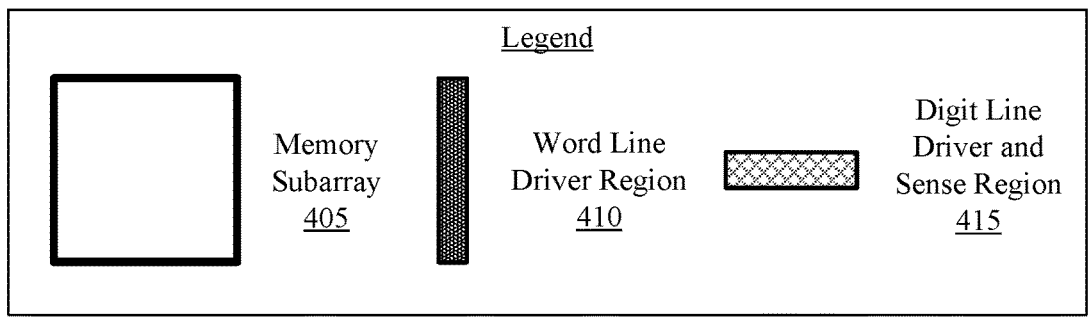

FIG. 4 illustrates an example of a memory architecture 400 that supports memory array circuit arrangement in accordance with examples as disclosed herein. The memory architecture 400 may be an example of aspects of a memory device as described with reference to FIGS. 1 and 2. The memory architecture 400, or various components thereof, may be an example of means for reducing power delivery impedance in a memory device. Additionally, or alternatively, the memory architecture 400, or various components thereof, may be an example of means for reducing signal propagation in a memory device. In the following description of the memory architecture 400, some component (e.g., digit line driver circuitry, word line driver circuitry, sense amplifier circuitry, interconnect circuitry, CuA circuitry, etc.) may also be omitted from the memory architecture 400, and other components (e.g., digit line driver circuitry, word line driver circuitry, sense amplifier circuitry, interconnect circuitry, CuA circuitry, etc.) may be added to the memory architecture 400.

In the example of FIG. 4, the memory architecture 400 may include a memory array, which may include one or more memory subarrays 405, including a memory subarray 405-*a*, a memory subarray 405-*b*, a memory subarray 405-*c*, and a memory subarray 405-*d*. The memory subarray 405-*a* may be adjacent to the memory subarray 405-*b*. The memory subarray 405-*c* may be adjacent to the memory subarray 405-*d*. Each of the one or more memory subarrays 405, including the memory subarray 405-*a*, the memory subarray 405-*b*, the memory subarray 405-*c*, and the memory subarray 405-*d* may include control circuitry formed over (e.g., directly over, over one material or layer and one or more other materials or layers, in contact with) a substrate. For example, each of the one or more memory subarrays 405, including the memory subarray 405-*a*, the memory subarray 405-*b*, the memory subarray 405-*c*, and the memory subarray 405-*d* may include a respective CuA circuitry, or the like. In the example of FIG. 4, each of the memory subarray 405-*a*, the memory subarray 405-*b*, the memory subarray 405-*c*, and the memory subarray 405-*d* may include a respective CuA circuitry combined to form a single CuA circuitry 420, which may be larger (e.g., 4×) than one or more CuA regions as described in FIG. 3.

The memory subarray 405-*a* may be configured with a word line driver region 410-*a*, which may include one or more driver circuitry to control operation for one or more (e.g., a subset or a set of) memory cells associated with the memory subarray 405-*a*. For example, the word line driver region 410-*a* may include one or more word line driver circuitry configured to selectively activate or deactivate a word line for one or more memory cells associated with the memory subarray 405-*a*. The word line driver region 410-*a* may extend in a first direction (e.g., a y-direction). Similarly, the memory subarray 405-*c* may be configured with a word line driver region 410-*b*, which may include one or more driver circuitry to control operation for one or more (e.g., a subset or a set of) memory cells associated with the memory subarray 405-*c*. For example, the word line driver region 410-*b* may include one or more word line driver circuitry configured to selectively activate or deactivate a word line for one or more memory cells associated with the memory subarray 405-*c*. The word line driver region 410-*b* may extend in the first direction (e.g., the y-direction). In some examples, the word line driver region 410-*a* and the word line driver region 410-*b* may be a single word line driver region.

The memory subarray 405-*b* may be configured with a digit line driver and sense region 415-*a*, which may include one or more driver circuitry to control operation for one or more (e.g., a subset or a set of) memory cells associated with the memory subarray 405-*b*. For example, the driver region 415-*a* may include one or more digit line driver and sense circuitry configured to selectively activate or deactivate a digit line for one or more memory cells associated with the memory subarray 405-*b*. The digit line driver and sense region 415-*a* may extend in a second direction (e.g., an x-direction). Similarly, the memory subarray 405-*d* may be configured with a digit line driver and sense region 415-*b*, which may include one or more driver circuitry to control operation for one or more memory cells associated with the memory subarray 405-*d*. For example, the digit line driver and sense region 415-*b* may include one or more digit line driver circuitry configured to selectively activate or deactivate a digit line for one or more memory cells associated with the memory subarray 405-*d*. The digit line driver and sense region 415-*b* may extend in the second direction (e.g., the x-direction). The memory subarray 405-*b* and the memory subarray 405-*d* may additionally or alternatively, include sense amplifier circuitry, which may be multiplexed with the digit line driver circuitry, to amplify an output for one or more memory cells associated with the memory subarray 405-*b* and the memory subarray 405-*d*.

In the example of FIG. 4, the memory subarray 405-*a* and the memory subarray 405-*c* may also be configured with a portion of the CuA circuitry 420 (e.g., a portion of a substrate). Additionally, or alternatively, the memory subarray 405-*b* and the memory subarray 405-*d* may also be configured with a portion of the CuA circuitry 420 (e.g., a portion of a substrate). Each of the one or more memory subarrays 405, including the memory subarray 405-*a*, the memory subarray 405-*b*, the memory subarray 405-*c*, and the memory subarray 405-*d* may include one or more interconnect regions (e.g., a socket feed through area). For example, each of the one or more memory subarrays 405, including the memory subarray 405-*a*, the memory subarray 405-*b*, the memory subarray 405-*c*, and the memory subarray 405-*d* may include a first interconnect region 425 extending in a first direction (e.g., y-direction) and a second interconnect region 430 extending in a second direction (e.g., x-direction). Each of the one or more memory subarrays 405, including the memory subarray 405-*a*, the memory subarray 405-*b*, the memory subarray 405-*c*, and the memory subarray 405-*d* may be associated with one or more interconnection layers (not shown) between a substrate and the first interconnect region 425 and the second interconnect region 430. The one or more interconnection layers may include a metal layer with the same or different resistivity.

The memory architecture 400 supports a greater area for CuA circuitry 420 that may result in lower power delivery impedance and shorter signal propagation without splitting CuA circuitry area. For example, the arrangement in the memory architecture 400 (e.g., the placement, the position, the location of) the word line driver regions 410 (e.g., word line driver circuitry), the digit line driver and sense regions

415 (e.g., digit line driver circuitry, sense amplifier circuitry multiplexed with the digit line driver circuitry), and the interconnect regions 425 and 430, result in an increase in a contiguous area used for CuA circuitry 420 that may result in lower power delivery and shorter signal propagation. For example, the arrangement in the memory architecture 400 (e.g., the placement, the position, the location of) the word line driver regions 410 (e.g., word line driver circuitry), the digit line driver and sense regions 415 (e.g., digit line driver circuitry, sense amplifier circuitry multiplexed with the digit line driver circuitry), and the interconnect regions 425 and 430, allows for the logic associated with the CuA circuitry 420 to be nearer to local interconnect to metal connection areas for easier placement, routing, and reduced signal resistance.

Figure 5:
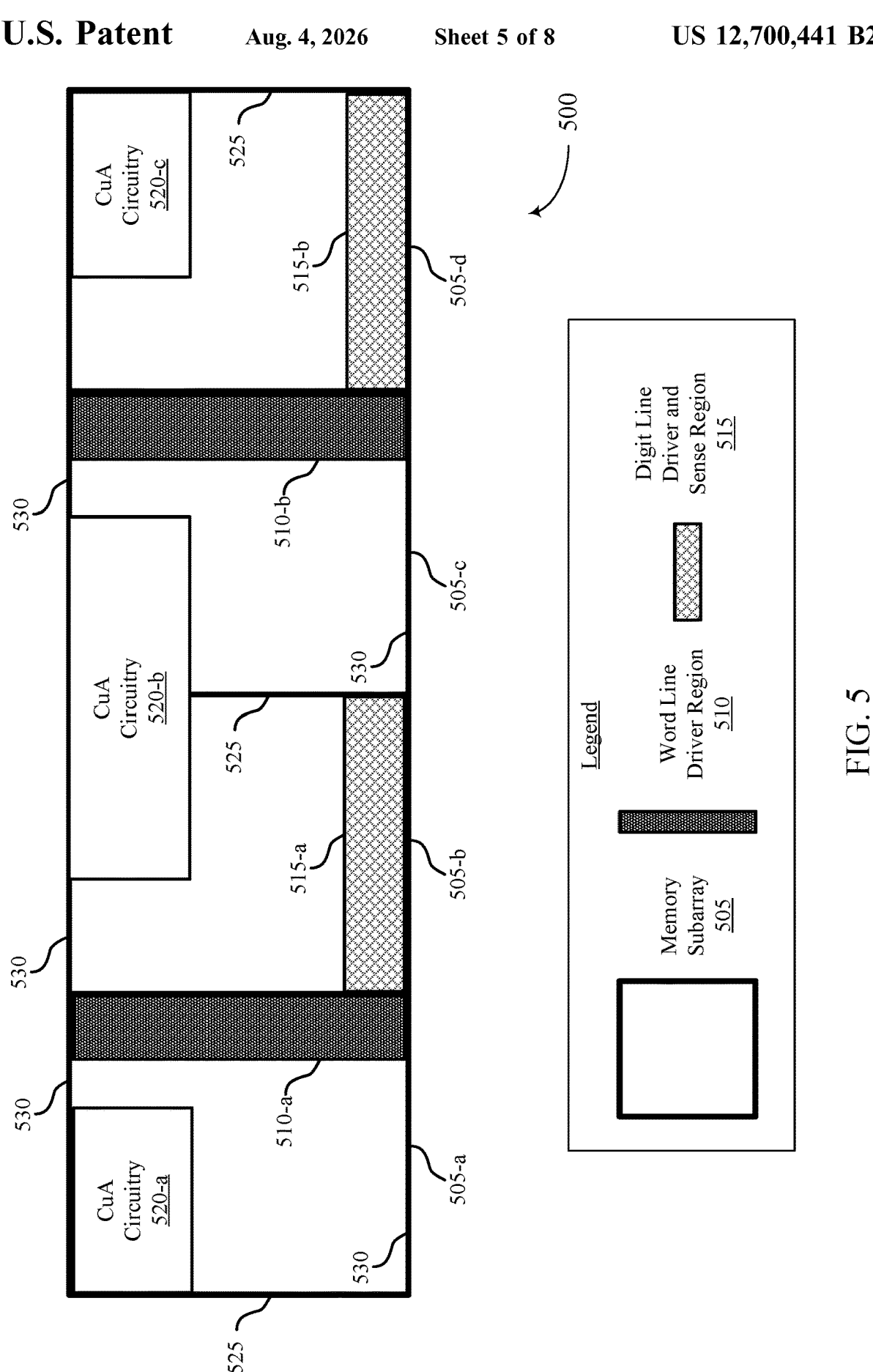

FIG. 5 illustrates an example of a memory architecture 500 that supports memory array circuit arrangement in accordance with examples as disclosed herein. The memory architecture 500 may be an example of aspects of a memory device as described with reference to FIGS. 1 and 2. The memory architecture 500, or various components thereof, may be an example of means for reducing power delivery impedance in a memory device. Additionally, or alternatively, the memory architecture 500, or various components thereof, may be an example of means for reducing signal propagation in a memory device. In the following description of the memory architecture 500, some component (e.g., digit line driver circuitry, word line driver circuitry, sense amplifier circuitry, interconnect circuitry, CuA circuitry, etc.) may also be omitted from the memory architecture 500, and other components (e.g., digit line driver circuitry, word line driver circuitry, sense amplifier circuitry, interconnect circuitry, CuA circuitry, etc.) may be added to the memory architecture 500.

In the example of FIG. 5, the memory architecture 500 may include a memory array, which may include one or more memory subarrays 505, including a memory subarray 505-*a*, a memory subarray 505-*b*, a memory subarray 505-*c*, and a memory subarray 505-*d*. The memory subarray 505-*a* may be adjacent to the memory subarray 505-*b*. The memory subarray 505-*b* may be adjacent to the memory subarray 505-*a* and the memory subarray 505-*c*. The memory subarray 505-*c* may be adjacent to the memory subarray 505-*b* and the memory subarray 505-*d*. The memory subarray 505-*d* may be adjacent to the memory subarray 505-*c*.

Each of the one or more memory subarrays 505, including the memory subarray 505-*a*, the memory subarray 505-*b*, the memory subarray 505-*c*, and the memory subarray 505-*d* may include control circuitry formed over (e.g., directly over, over one material or layer and one or more other materials or layers, in contact with) a substrate. For example, each of the one or more memory subarrays 505, including the memory subarray 505-*a*, the memory subarray 505-*b*, the memory subarray 505-*c*, and the memory subarray 505-*d* may include a respective CuA circuitry, or the like. In the example of FIG. 5, the memory subarray 505-*a* may include a CuA circuitry 520-*a* and the memory subarray 505-*d* may include a CuA circuitry 520-*c*. In the example of FIG. 5, the memory subarray 505-*b* and the memory subarray 505-*c* may include a respective CuA circuitry combined to form a single CuA circuitry 520-*b*.

The memory subarray 505-*a* may be configured with a word line driver region 510-*a*, which may include one or more driver circuitry to control operation for one or more memory cells associated with the memory subarray 505-*a* and 505-*b*. For example, the word line driver region 510-*a* may include one or more word line driver circuitry configured to selectively activate or deactivate a word line for one or more memory cells associated with the memory subarray 505-*a* and 505-*b*. The word line driver region 510-*a* may extend in a first direction (e.g., a y-direction). The word line driver region 510-*a* may traverse a first edge of the memory subarray 505-*a* opposite a second edge of the memory subarray 505-*a* adjacent to the memory subarray 505-*b*. Similarly, the memory subarray 505-*c* may be configured with a word line driver region 510-*b*, which may include one or more driver circuitry to control operation for one or more memory cells associated with the memory subarray 505-*c* and 505-*d*. For example, the word line driver region 510-*b* may include one or more word line driver circuitry configured to selectively activate or deactivate a word line for one or more memory cells associated with the memory subarray 505-*c* and 505-*d*. The word line driver region 510-*b* may extend in the first direction (e.g., the y-direction). The word line driver region 510-*b* may traverse a first edge of the memory subarray 505-*c* opposite a second edge of the memory subarray 505-*c* adjacent to the memory subarray 505-*d*.

The memory subarray 505-*b* may be configured with a digit line driver and sense region 515-*a*, which may include one or more driver circuitry to control operation for one or more memory cells associated with the memory subarray 505-*b*. For example, the digit line driver and sense region 515-*a* may include one or more digit line driver and sense circuitry configured to selectively activate or deactivate a digit line for one or more memory cells associated with the memory subarray 505-*b*. The digit line driver and sense region 515-*a* may extend in a second direction (e.g., an x-direction).

The memory subarray 505-*d* may be configured with a digit line driver and sense region 515-*b*, which may include one or more driver circuitry to control operation for one or more memory cells associated with the memory subarray 505-*d*. For example, the digit line driver and sense region 515-*b* may include one or more digit line driver circuitry configured to selectively activate or deactivate a digit line for one or more memory cells associated with the memory subarray 505-*d*. The digit line driver and sense region 515-*b* may extend in the second direction (e.g., the x-direction).

The memory subarray 505-*b* and the memory subarray 505-*d* may additionally or alternatively, include sense amplifier circuitry multiplexed with one or more digit lines to amplify an output for one or more memory cells associated with the memory subarray 505-*b* and the memory subarray 505-*d*.

Each of the one or more memory subarrays 505, including the memory subarray 505-*a*, the memory subarray 505-*b*, the memory subarray 505-*c*, and the memory subarray 505-*d* may include one or more interconnect regions (e.g., socket feed through areas along edges with no connections to word lines or digit lines). For example, each of the one or more memory subarrays 505, including the memory subarray 505-*a*, the memory subarray 505-*b*, the memory subarray 505-*c*, and the memory subarray 505-*d* may include a first interconnect region 525 extending in a first direction (e.g., y-direction) and a second interconnect region 530 extending in a second direction (e.g., x-direction). Each of the one or more memory subarrays 505, including the memory subarray 505-*a*, the memory subarray 505-*b*, the memory subarray 505-*c*, and the memory subarray 505-*d* may be associated with one or more interconnection layers between a substrate and the first interconnect region 525 and the second interconnect region 530. The one or more interconnection layers may include a metal layer with the same or different resistivity.

Accordingly, the memory architecture 500 supports a greater area for CuA circuitry 520 that may result in lower power delivery impedance and shorter signal propagation without splitting CuA circuitry area.

Figure 6:
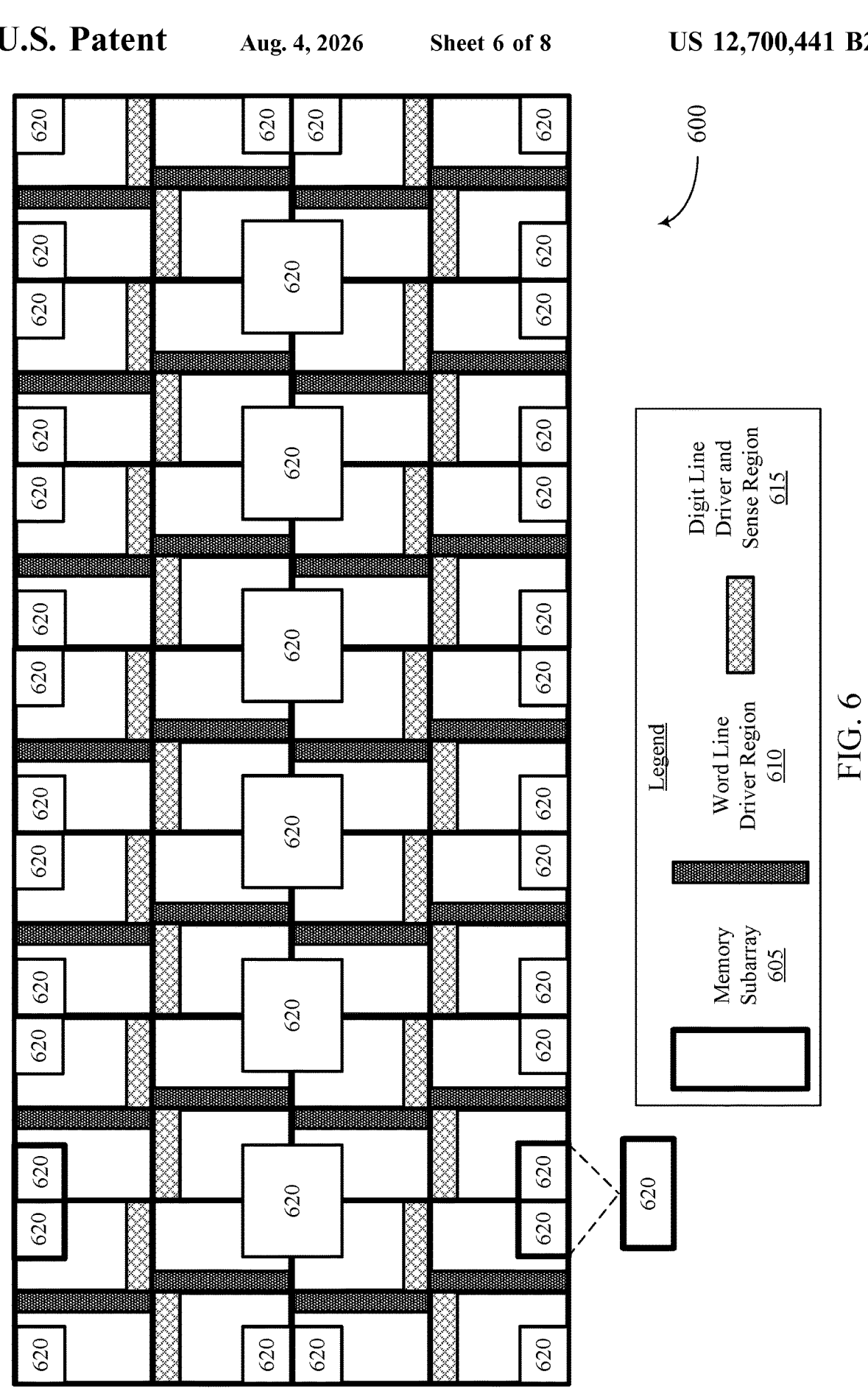

FIG. 6 illustrates an example of a memory architecture 600 that supports memory array circuit arrangement in accordance with examples as disclosed herein. The memory architecture 600 may be an example of aspects of a memory device as described with reference to FIGS. 1 and 2. The memory architecture 600, or various components thereof, may be an example of means for reducing power delivery impedance in a memory device. Additionally, or alternatively, the memory architecture 600, or various components thereof, may be an example of means for reducing signal propagation in a memory device. In the following description of the memory architecture 600, some component (e.g., digit line driver circuitry, word line driver circuitry, sense amplifier circuitry, interconnect circuitry, CuA circuitry, etc.) may also be omitted from the memory architecture 600, and other components (e.g., digit line driver circuitry, word line driver circuitry, sense amplifier circuitry, interconnect circuitry, CuA circuitry, etc.) may be added to the memory architecture 600.

The memory architecture 600 may include a memory array, which may include one or more memory subarrays 605. Each of one or more memory subarray 605 may be configured with a word line driver region 610 which may include one or more driver circuitry to control operation for one or more memory cells associated with the one or more memory subarrays 605. For example, a word line driver region 610 may include one or more word line driver circuitry configured to selectively activate or deactivate a word line for one or more memory cells associated with a memory subarray 605. The word line driver region 610 may extend in a first direction (e.g., a y-direction). The word line driver region 610 may traverse a first edge of a memory subarray 605 opposite a second edge of the memory subarray 605 adjacent to another memory subarray 605.

Each of one or more memory subarray 605 may be configured with a digit line driver and sense region 615, which may include one or more driver circuitry to control operation for one or more memory cells associated with the one or more memory subarrays 605. For example, a digit line driver and sense region 615 may include one or more word line driver circuitry configured to selectively activate or deactivate a digit line for one or more memory cells associated with a memory subarray 605. The digit line driver and sense region 615 may extend in a second direction (e.g., an x-direction). The digit line driver and sense region 615 may traverse a first edge of a memory subarray 605 opposite a second edge of the memory subarray 605 adjacent to another memory subarray 605.

In the example of FIG. 6, each of the one or more memory subarrays 605 may include control circuitry formed over (e.g., directly over, over one material or layer and one or more other materials or layers, in contact with) a substrate. For example, each of the one or more memory subarrays 605 may include a respective CuA circuitry 620, or the like. In the example of FIG. 6, two or more memory subarray 605 may include a respective CuA circuitry combined to form a single CuA circuitry 620.

Accordingly, the memory architecture 600 supports a greater area for CuA circuitry 620 that may result in lower power delivery impedance and shorter signal propagation without splitting CuA circuitry area.

Figure 7:
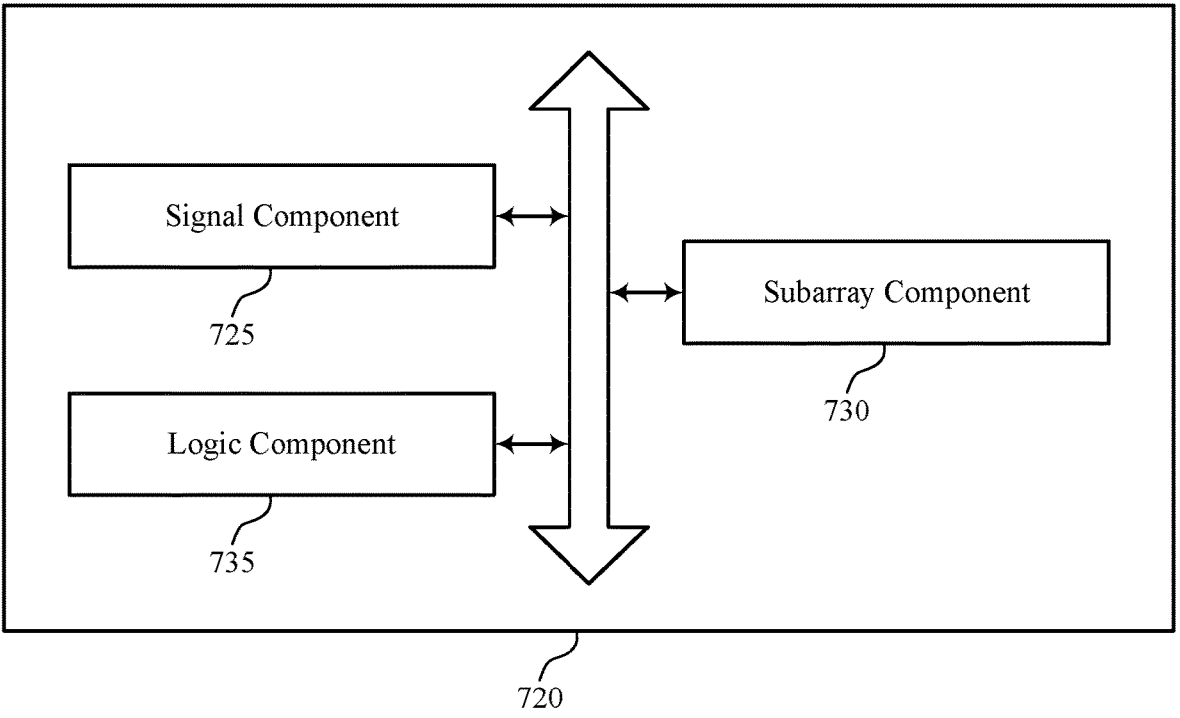
FIG. 7 illustrates a block diagram of a memory device that supports memory array circuit arrangement in accordance with examples as disclosed herein.

FIG. 7 illustrates a block diagram 700 of a memory device 720 that supports memory array circuit arrangement in accordance with examples as disclosed herein. The memory device 720 may be an example of aspects of a memory device as described with reference to FIGS. 1 through 3. The memory device 720, or various components thereof, may be an example of means for performing various aspects of memory array circuit arrangement as described herein. For example, the memory device 720 may include a signal component 725, a subarray component 730, a logic component 735, or any combination thereof. Each of these components may communicate, directly or indirectly, with one another (e.g., via one or more buses).

The signal component 725 may be configured as or otherwise support a means for generating a logic signal for an array of memory cells. The subarray component 730 may be configured as or otherwise support a means for transferring, within the array of memory cells, the logic signal from a first portion of a first substrate and a second portion of a second substrate via a first interconnect extending in a first direction and traversing a first edge of the first substrate and a second interconnect extending in a second direction and traversing a first edge of the second substrate, where a first subarray of the array of memory cells includes the first substrate and a second subarray of the array of memory cells includes the second substrate. The logic component 735 may be configured as or otherwise support a means for storing a logic state for the array of memory cells based at least in part on the transferring.

FIG. 8 illustrates a flowchart showing a method 800 that supports memory array circuit arrangement in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally, or alternatively, the memory device may perform aspects of the described functions using special-purpose hardware.

At 805, the method may include generating a logic signal for an array of memory cells. The operations of 805 may be performed in accordance with examples as disclosed herein. In some examples, aspects of the operations of 805 may be performed by a signal component 725 as described with reference to FIG. 7.

At 810, the method may include transferring, within the array of memory cells, the logic signal from a first portion of a first substrate and a second portion of a second substrate via a first interconnect extending in a first direction and traversing a first edge of the first substrate and a second interconnect extending in a second direction and traversing a first edge of the second substrate, where a first subarray of the array of memory cells includes the first substrate and a second subarray of the array of memory cells includes the second substrate. The operations of 810 may be performed in accordance with examples as disclosed herein. In some examples, aspects of the operations of 810 may be performed by a subarray component 730 as described with reference to FIG. 7.

At 815, the method may include storing a logic state for the array of memory cells based at least in part on the transferring. The operations of 815 may be performed in accordance with examples as disclosed herein. In some examples, aspects of the operations of 815 may be performed by a logic component 735 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for generating a logic signal for an array of memory cells; transferring, within the array of memory cells, the logic signal from a first portion of a first substrate and a second portion of a second substrate via a first interconnect extending in a first direction and traversing a first edge of the first substrate and a second interconnect extending in a second direction and traversing a first edge of the second substrate, where a first subarray of the array of memory cells includes the first substrate and a second subarray of the array of memory cells includes the second substrate; and storing a logic state for the array of memory cells based at least in part on the transferring.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 2: An apparatus, including: an array of memory cells including a subarray, where the subarray includes: a first interconnect extending in a first direction and traversing at least a first portion of a first substrate of the subarray, the first interconnect coupled with the first portion of the first substrate and a first interconnection layer; and a second interconnect extending in a second direction and traversing at least a second portion of the first substrate of the subarray, the second interconnect coupled with the second portion of the first substrate and the first interconnection layer.

Aspect 3: The apparatus of aspect 2, further including: a first driver extending in the second direction; or a second driver extending in the first direction.

Aspect 4: The apparatus of aspect 3, where: the array of memory cells includes a plurality of subarrays, the plurality of subarrays including a first group of subarrays; and the first group of subarrays including the subarray, a second subarray adjacent to the subarray, a third subarray adjacent to the subarray, and a fourth subarray adjacent to the second subarray and the third subarray.

Aspect 5: The apparatus of aspect 4, where each subarray of the first group of subarrays includes a respective substrate, the respective substrate combined to form a single substrate that includes the first substrate.

Aspect 6: The apparatus of any of aspects 4 through 5, where: the subarray includes a first portion of the first driver associated with a first subset of word lines of the array of memory cells; the third subarray includes a second portion of the first driver associated with a second subset of word lines of the array of memory cells different from the first subset of word lines; the second subarray includes a first portion of the second driver associated with a first subset of digit lines of the array of memory cells; and the fourth subarray includes a second portion of the second driver associated with a second subset of digit lines of the array of memory cells different from the first subset of digit lines.

Aspect 7: The apparatus of aspect 6, where: the first portion of the first driver traverses a first edge of the subarray opposite a second edge of the subarray adjacent to the second subarray; the second portion of the first driver traverses a first edge of the third subarray opposite a second edge of the third subarray adjacent to the fourth subarray; the first portion of the second driver traverses a first edge of the second subarray opposite a second edge of the second subarray adjacent to the fourth subarray; and the second portion of the second driver traverses a first edge of the fourth subarray opposite a second edge of the fourth subarray adjacent to the second subarray.

Aspect 8: The apparatus of any of aspects 3 through 7, where the first driver is associated with a subset of word lines of the array of memory cells and the second driver is associated with a subset of digit lines of the array of memory cells.

Aspect 9: The apparatus of any of aspects 3 through 8, where the first driver is a word line driver and the second driver is a sense amplifier multiplexed with digit lines.

Aspect 10: The apparatus of any of aspects 2 through 9, where the first substrate is coupled with a second interconnection layer between the first substrate and the first and second interconnects.

Aspect 11: The apparatus of aspect 10, where the first interconnection layer includes a first metal of a first resistivity and the second interconnection layer includes a second metal of a second resistivity higher than the first resistivity.

Aspect 12: The apparatus of any of aspects 2 through 11, where the first substrate includes complementary metal-oxide semiconductor circuitry under arrays.

Aspect 13: The apparatus of any of aspects 2 through 12, where the first portion and the second portion of the first substrate include at least a first edge and a second edge of the first substrate, respectively.

Aspect 14: The apparatus of any of aspects 2 through 13, where the first interconnect and the second interconnect traverse socket feed through areas positioned on a respective edge of the subarray excluding a word line driver or a digit liner driver.

An apparatus is described. The following provides an overview of aspects of the apparatus as described herein:

Aspect 15: An apparatus, including: an array of memory cells including: a substrate; a first subarray including a first portion of the substrate; a second subarray including a second portion of the substrate; a third subarray including a third portion of the substrate; and a fourth subarray including a fourth portion of the substrate, where each subarray includes: a first interconnect extending in a first direction and traversing at least a first portion of the first subarray, the second subarray, the third subarray, and the fourth subarray; and a second interconnect extending in a second direction different from the first direction and traversing at least a second portion of the first subarray, the second subarray, the third subarray, and the fourth subarray.

Aspect 16: The apparatus of aspect 15, where: the first subarray includes a first driver extending in the second direction and traversing a third portion of the first subarray opposite the second portion of the first subarray; the second subarray includes a second driver extending in the first direction and traversing a third portion of the second subarray opposite the first portion of the second subarray; the third subarray includes a third driver extending in the second direction and traversing a third portion of the third subarray opposite the second portion of the third subarray; and the fourth subarray includes a fourth driver extending in the first direction and traversing a third portion of the fourth subarray opposite the first portion of the fourth subarray.

Aspect 17: The apparatus of aspect 16, where: the first driver and the third driver are associated with a subset of word lines of the array of memory cells; and the second driver and the fourth driver are associated with a subset of digit lines of the array of memory cells.

Aspect 18: The apparatus of any of aspects 16 through 17, where: the first driver and the third driver are word line drivers: and the second driver and the fourth driver are sense amplifier multiplexed with digit lines.

Aspect 19: The apparatus of any of aspects 16 through 18, where the first portion, the second portion, and the third portion of each subarray include a first edge, a second edge, and a third edge of each subarray, respectively.

Aspect 20: The apparatus of any of aspects 15 through 19, where: the first direction is perpendicular to the second direction; and the first interconnect and the second interconnect intersect at a node adjacent to the first subarray, the second subarray, the third subarray, and the fourth subarray.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
an array of memory cells comprising a subarray, wherein the subarray comprises:
a first interconnect extending in a first direction and traversing at least a first portion of a first substrate of the subarray, the first interconnect coupled with the first portion of the first substrate and a first interconnection layer, wherein the first interconnect is a socket feed-through region that does not electrically contact any word line or digit line; and
a second interconnect extending in a second direction and traversing at least a second portion of the first substrate of the subarray, the second interconnect coupled with the second portion of the first substrate and the first interconnection layer, wherein the second interconnect is a socket feed-through region that does not electrically contact any word line or digit line and the first portion and the second portion of the first substrate comprise at least a first edge and a second edge of the first substrate, respectively, and wherein the first substrate comprises complementary metal-oxide-semiconductor circuitry under arrays (CuA) that is adjacent to the first edge and the second edge.

2. The apparatus of claim 1, further comprising:
a first driver extending in the second direction; or
a second driver extending in the first direction.

3. The apparatus of claim 2, wherein:
the array of memory cells comprises a plurality of subarrays, the plurality of subarrays comprising a first group of subarrays; and the first group of subarrays comprising the subarray, a second subarray adjacent to the subarray, a third subarray adjacent to the subarray, and a fourth subarray adjacent to the second subarray and the third subarray.

4. The apparatus of claim 3, wherein each subarray of the first group of subarrays comprises a respective substrate, the respective substrate combined to form a single substrate that comprises the first substrate.

5. The apparatus of claim 3, wherein:
the subarray comprises a first portion of the first driver associated with a first subset of word lines of the array of memory cells;
the third subarray comprises a second portion of the first driver associated with a second subset of word lines of the array of memory cells different from the first subset of word lines;
the second subarray comprises a first portion of the second driver associated with a first subset of digit lines of the array of memory cells; and
the fourth subarray comprises a second portion of the second driver associated with a second subset of digit lines of the array of memory cells different from the first subset of digit lines.

6. The apparatus of claim 5, wherein:
the first portion of the first driver traverses a first edge of the subarray opposite a second edge of the subarray adjacent to the second subarray;
the second portion of the first driver traverses a first edge of the third subarray opposite a second edge of the third subarray adjacent to the fourth subarray;
the first portion of the second driver traverses a first edge of the second subarray opposite a second edge of the second subarray adjacent to the fourth subarray; and
the second portion of the second driver traverses a first edge of the fourth subarray opposite a second edge of the fourth subarray adjacent to the second subarray.

7. The apparatus of claim 2, wherein the first driver is associated with a subset of word lines of the array of memory cells and the second driver is associated with a subset of digit lines of the array of memory cells.

8. The apparatus of claim 2, wherein the first driver is a word line driver and the second driver is a sense amplifier multiplexed with digit lines.

9. The apparatus of claim 1, wherein the first substrate is coupled with a second interconnection layer between the first substrate and the first and second interconnects.

10. The apparatus of claim 9, wherein the first interconnection layer comprises a first metal of a first resistivity and the second interconnection layer comprises a second metal of a second resistivity higher than the first resistivity.

11. The apparatus of claim 1, wherein the first interconnect and the second interconnect traverse through areas positioned on a respective edge of the subarray excluding a word line driver or a digit liner driver.

* * * * *